United States Patent
Chae (10) Patent No.: US 8,009,490 B2
(45) Date of Patent: Aug. 30, 2011

(54) MEMORY INTERFACE CIRCUIT AND MEMORY SYSTEM INCLUDING THE SAME

(75) Inventor: Kwan-Yeob Chae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 135 days.

(21) Appl. No.: 12/453,523

(22) Filed: May 14, 2009

(65) Prior Publication Data

US 2009/0285042 A1    Nov. 19, 2009

(30) Foreign Application Priority Data

May 14, 2008    (KR) .................. 10-2008-0044487

(51) Int. Cl.
  *G11C 7/00* (2006.01)

(52) U.S. Cl. .............. 365/193; 365/194; 365/233.1

(58) Field of Classification Search ........... 365/193, 365/194, 233.1
See application file for complete search history.

(56) References Cited

U.S. PATENT DOCUMENTS

| | | | |
|---|---|---|---|
| 5,905,391 A * | 5/1999 | Mooney | 327/161 |
| 7,161,402 B1 | 1/2007 | Sompur et al. | |
| 7,539,078 B2 * | 5/2009 | Matulik et al. | 365/233.1 |
| 7,593,288 B2 * | 9/2009 | Kim et al. | 365/233.12 |
| 7,787,326 B1 * | 8/2010 | Sharpe-Geisler et al. | 365/233.12 |
| 2005/0083099 A1 * | 4/2005 | Lin | 327/295 |
| 2005/0190193 A1 | 9/2005 | Freker et al. | |

FOREIGN PATENT DOCUMENTS

| | | |
|---|---|---|
| JP | 2004-139268 | 5/2004 |
| KR | 10-2004-0023804 | 3/2004 |

* cited by examiner

*Primary Examiner* — Pho M Luu
(74) *Attorney, Agent, or Firm* — Harness, Dickey & Pierce, PLC (57) ABSTRACT

The memory interface circuit may include a master delay unit and a slave delay unit. The master delay unit generates a control signal for controlling a delay time based on a clock signal. The slave delay unit selects one signal of an inversion signal of the clock signal and a data strobe signal in response to a mode signal and delays the selected signal in response to the control signal. The slave delay unit selectively outputs a delayed clock signal that may be delayed by a first phase with respect to the clock signal or a delayed data strobe signal that may be delayed by a second phase with respect to the data strobe signal.

21 Claims, 6 Drawing Sheets

MEMORY INTERFACE CIRCUIT AND MEMORY SYSTEM INCLUDING THE SAME

PRIORITY STATEMENT

This application claims priority under U.S.C. §119 to Korean Patent Application No. 10-2008-0044487, filed on May 14, 2008, in the Korean Intellectual Property Office (KIPO), the entire contents of which are incorporated herein by reference.

BACKGROUND

1. Technical Field

Example embodiments relate to a memory interface circuit and a memory system, and more particularly to the memory interface circuit capable of decreasing the number of delay locked loops, and a memory system including the memory interface circuit.

2. Description of the Related Art

Typically, a master delay locked loop and a plurality of slave delay locked loops may be utilized to generate signals for writing or reading data in high-speed semiconductor memory device, e.g., double data rate synchronous dynamic random access memory (DDR SDRAM). For example, a signal delayed by a phase of 270 degrees with respect to a clock signal may be utilized to write data to a memory block and a signal delayed by a phase of 90 degrees with respect to a data strobe signal may be utilized to read data from the memory block. The master delay locked loop and the slave delay locked loops may be utilized in a double data rate memory to delay the signals. The signals may be delayed by respective slave delay locked loops because the delayed phase of the delayed clock signal for writing data may be different from the delayed phase of the delayed data strobe signal for reading data. Typically, the double data rate memory requires two slave delay locked loops per 8 bits. As the number of the delay locked loops in the memory interface circuit may be increased, a size of a semiconductor chip may be increased and power consumption may also be increased.

SUMMARY

Example embodiments provide a memory interface circuit capable of decreasing the number of slave delay locked loops and decreasing a size of a chip and power consumption.

Example embodiments provide a memory system including a memory interface circuit capable of decreasing the number of slave delay locked loops and decreasing a size of a chip and power consumption.

In example embodiments, a memory interface circuit may include a master delay unit and a slave delay unit. The master delay unit may generate a control signal for controlling a delay time based on a clock signal. The slave delay unit may select one signal of an inversion signal of clock signal and a data strobe signal in response to a mode signal and may delay the selected signal in response to the control signal. The slave delay unit may selectively output a delayed clock signal delayed by a first phase with respect to the clock signal or a delayed data strobe signal delayed by a second phase with respect to the data strobe signal.

In example embodiments, the mode signal may have a first logic level in a data write mode, and may have a second logic level in a data read mode. The slave delay unit may output the delayed clock signal in the data write mode and may output the delayed data strobe signal in the data read mode.

In example embodiments, the slave delay unit may include an inverter, a multiplexer, a slave delay locked loop and an output unit. The inverter may invert the clock signal and may output the inversion signal of the clock signal. The multiplexer may select the one signal of the inversion signal of the clock signal and the data strobe signal in response to the mode signal. The slave delay locked loop may delay the selected signal in response to the control signal. The output unit may receive an output signal of the slave delay locked loop and may output the output signal of the slave delay locked loop selectively as the delayed clock signal or as the delayed data strobe signal. The multiplexer may select the inversion signal of the clock signal in a data write mode and may select the data strobe signal in a data read mode.

In example embodiments, the output unit may output the delayed clock signal in a data write mode and may output the delayed data strobe signal in a data read mode. The output unit may include a first logic gate and a second logic gate. The first logic gate may receive the output signal of the slave delay locked loop and the mode signal and may perform an AND operation on the output signal of the slave delay locked loop and the mode signal. The second logic gate may receive the output signal of the slave delay locked loop and an inversion signal of the mode signal and may perform an AND operation on the output signal of the slave delay locked loop and the inversion signal of the mode signal.

In example embodiments, the slave delay locked loop may delay the selected signal by a phase of about 90 degrees. The first phase may be about 270 degrees and the second phase may be about 90 degrees. In example embodiments, the memory interface circuit may be a double data rate (DDR) memory interface circuit.

In example embodiments, a memory interface circuit may include a master delay locked loop, a slave delay locked loop, an inverter and a selecting unit. The master delay locked loop generates a control signal for controlling a delay time of a first signal transmitted through a first delay path or a second signal transmitted through a second delay path based on a clock signal. The slave delay locked loop may be shared by the first delay path and the second delay path, and delays the first signal transmitted through the first delay path or the second signal transmitted through the second delay path by a same phase in response to the control signal. The inverter may invert the first signal transmitted through the first delay path. The selecting unit may activate one of the first delay path and the second delay path in response to a mode signal.

In example embodiments, the selecting unit may activate the first delay path in a data write mode and may activate the second delay path in a data read mode. In example embodiments, the selecting unit may include a multiplexer and a logic circuit. The multiplexer may provide the first signal or the second signal to the slave delay locked loop by selecting one of the first delay path and the second delay path in response to the mode signal. The logic circuit may activate the delay path selected by the multiplexer and may deactivate non-selected delay path.

The logic circuit may include a first logic gate and a second logic gate. The first logic gate may activate the first delay path in the data write mode and may deactivate the first delay path in the data read mode in response to the mode signal. The second logic gate may deactivate the second delay path in the data write mode and may activate the second delay path in the data read mode in response to the mode signal.

In example embodiments, the clock signal may be delayed by the first delay path and a data strobe signal may be delayed by the second delay path. The slave delay locked loop may delay a signal transmitted through the activated delay path by a phase of about 90 degrees. In example embodiments, an output signal of the activated delay path may be provided to a memory block including a plurality of memory cells.

In example embodiments, a memory cell block may include a memory cell block, a memory controller and a memory interface circuit. The memory cell block may include a plurality of memory cells for storing data. The memory controller may control access for writing the data to the memory cell block or reading the data from the memory cell block. The memory interface circuit may transfer the data between the memory controller and the memory cell block. The memory interface circuit may include a master delay unit and a slave delay unit. The master delay unit may generate a control signal for controlling a delay time based on a clock signal. The slave delay unit may select one signal of an inversion signal of the clock signal and a data strobe signal in response to a mode signal and delays the selected signal in response to the control signal. The slave delay unit may selectively output a delayed clock signal delayed by a first phase with respect to the clock signal or a delayed data strobe signal delayed by a second phase with respect to the data strobe signal to the memory cell block.

In example embodiments, the slave delay unit may include an inverter, a multiplexer, a slave delay locked loop and an output unit. The inverter may invert the clock signal and may output the inversion signal of the clock signal. The multiplexer may select the one signal of the inversion signal of the clock signal and the data strobe signal in response to the mode signal. The slave delay locked loop may delay the selected signal in response to the control signal. The output unit may receive an output signal of the slave delay locked loop and may output the output signal of the slave delay locked loop selectively as the delayed clock signal or as the delayed data strobe signal.

In example embodiments, the first phase may be about 270 degrees and the second phase may be about 90 degrees. Accordingly, in the memory interface circuit and the memory system according to some example embodiments, the delay locked loop may be shared by paths where the clock signal and the data strobe signal may be delayed by phases different from each other. Thus, the number of the delay locked loops may include in the memory interface circuit may be decreased, and thus, a size of a semiconductor chip and power consumption may be decreased.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described in detail with reference to the accompanying drawings. However, various modifications and adaptations may be made to example embodiments to be described below, and example embodiments may be implemented in various forms without the scope thereof being limited to example embodiments to be described below. Example embodiments are provided to more completely explain the inventive concept to those of ordinary skill in the art. In the accompanying drawings, like reference numerals refer to like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
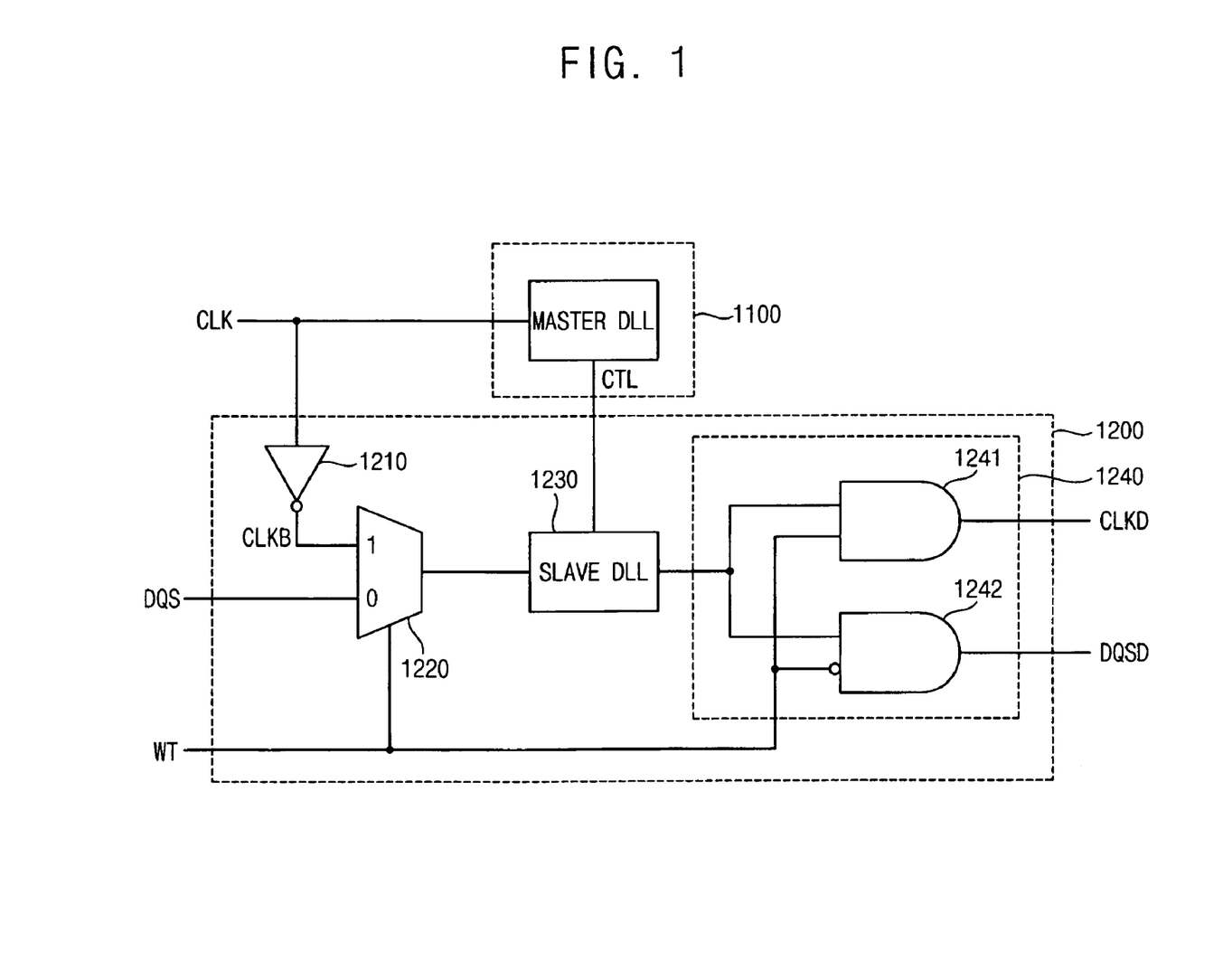
FIG. 1 is a block diagram illustrating a memory interface circuit according to example embodiments.

FIG. 1 is a block diagram illustrating a memory interface circuit according to example embodiments. Referring to FIG. 1, the memory interface circuit may include a master delay unit 1100 and a slave delay unit 1200. The master delay unit 1100 may generate a control signal CTL that controls a delay time based on a clock signal CLK. The master delay unit 1100 may be implemented with a delay locked loop.

The slave delay unit 1200 may select one signal of an inversion signal CLKB of the clock signal CLK and a data strobe signal DQS in response to a mode signal WT and may delay the selected signal in response to the control signal CTL. The slave delay unit 1200 may selectively output a delayed clock signal CLKD that may be delayed by a first phase with respect to the clock signal CLK or a delayed data strobe signal DQSD that may be delayed by a second phase with respect to the data strobe signal DQS.

The first phase may be different from the second phase, and a difference between the first phase and the second phase may be about 180 degrees. For example, the first phase may be about 270 degrees and the second phase may be about 90 degrees. However, the first phase and the second phase may be varied according to example embodiments. The slave delay unit 1200 may selectively output the delayed clock signal CLKD delayed by a phase of about 270 degrees with respect to the clock signal CLK or the delayed data strobe signal DQSD delayed by a phase of about 90 degrees with respect to the data strobe signal DQS. The mode signal WT may indicate whether a memory block where data is input or output through the memory interface circuit operates in a data write mode or a data read mode. The mode signal WT may have a first logic level when the memory block operates in the data write mode and may have a second logic level that is an inverted level of the first logic level when the memory block operates in the data read mode.

The slave delay unit 1200 may include an inverter 1210, a multiplexer 1220, a slave delay locked loop 1230 and an output unit 1240. The inverter 1210 may invert the clock signal CLK and may output the inversion signal CLKB of the clock signal CLK. A phase difference between the clock signal CLK and the inversion signal CLKB may be about 180 degrees.

The multiplexer 1220 may select one signal of the inversion signal CLKB of the clock signal CLK and the data strobe signal DQS in response to the mode signal WT. The multiplexer 1220 may select the inversion signal CLKB of the clock signal CLK when the mode signal WT has the first logic level and may select the data strobe signal DQS when the mode signal WT has the second logic level. In example embodiments, the first logic level may be a logic high level and the second logic level may be a logic low level. In example embodiments, the first logic level may be the logic low level and the second logic level may be the logic high level. The signal selected by the multiplexer 1220 may be provided to the slave delay locked loop 1230 as an input signal of the slave delay locked loop 1230.

The slave delay locked loop 1230 may delay the signal selected by the multiplexer 1220 in response to the control signal CTL of the master delay locked loop 1100. The slave delay locked loop 1230 may delay the selected signal by the same phase regardless of whether the inversion signal CLKB of the clock signal CLK may be selected by the multiplexer 1220 or the data strobe signal DQS may be selected by the multiplexer 1220. In example embodiments, the slave delay locked loop 1230 may delay the signal selected by the multiplexer 1220 by a phase of about 90 degrees.

The output unit 1240 may receive an output signal of the slave delay locked loop 1230 and may output the output signal of the slave delay locked loop 1230 as the delayed clock signal CLKD delayed with respect to the clock signal CLK or as the delayed data strobe signal DQSD delayed with respect to the data strobe signal DQS. The output unit 1240 may selectively output the delayed clock signal CLKD or the delayed data strobe signal DQSD in response to the mode signal WT. In example embodiments, the delayed clock signal CLKD or the delayed data strobe signal DQSD may be provided to memory cell blocks including a plurality of memory cells.

In the data write mode, the multiplexer 1220 may select the inversion signal CKLB of the clock signal CLK and the output unit 1240 may provide the delayed clock signal CLKD to the memory cell block. In the data read mode, the multiplexer 1220 may select the data strobe signal DQS and the output unit 1240 may provide the delayed data strobe signal DQSD to the memory cell block.

The output unit 1240 may include logic circuits. As described in FIG. 1, the output unit 1240 may include a first logic gate 1241 and a second logic gate 1242. The first logic gate 1241 may be implemented with a first AND gate that receives the output signal of the slave delay locked loop 1230 and the mode signal WT, and outputs the delayed clock signal CLKD. The second logic gate 1242 may be implemented with a second AND gate that receives the output signal of the slave delay locked loop 1230 and an inversion signal of the mode signal WT, and outputs the delayed data strobe signal DQSD. Thus, the output unit 1240 may output the output signal of the slave delay locked loop 1230 as the delayed clock signal CLKD when the mode signal WT has the first logic level and may output the output signal of the slave delay locked loop

1230 as the delayed data strobe signal DQSD when the mode signal WT has the second logic level.

Figure 2:
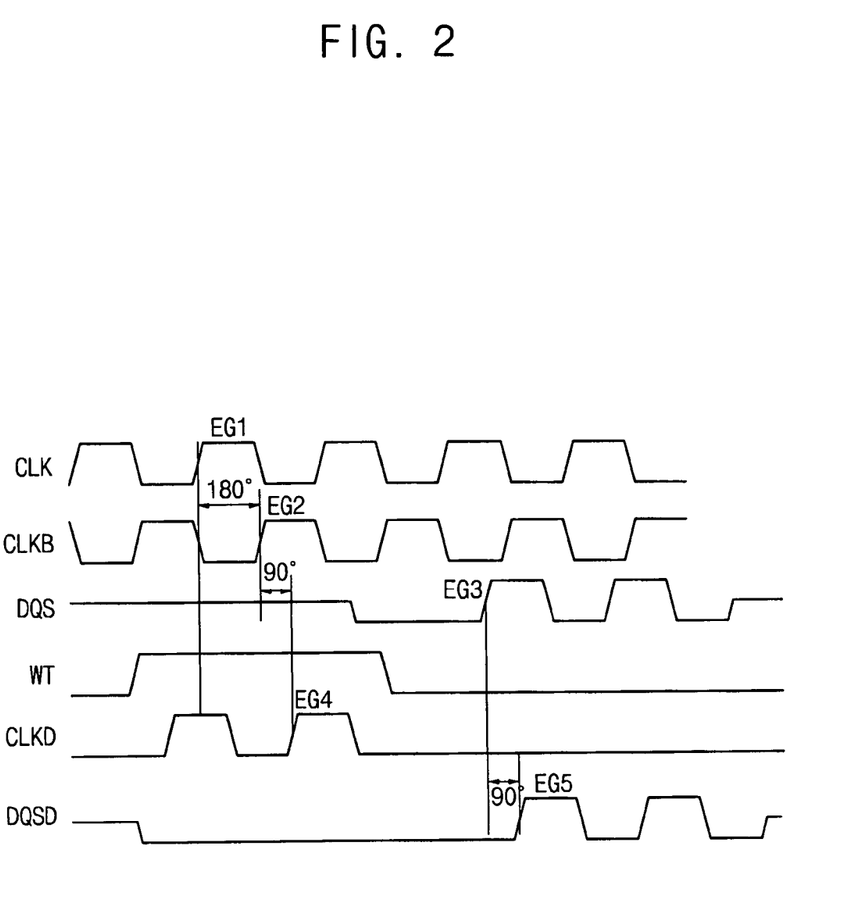
FIG. 2 is a timing diagram illustrating a waveform of signals input or output through a memory interface circuit according to example embodiments.

FIG. 2 is a timing diagram illustrating a waveform of signals input or output through a memory interface circuit according to example embodiments. Referring to FIG. 1 and FIG. 2, the clock signal CLK may be substantially delayed by a phase of about 180 degrees when the clock signal CLK is inverted by the inverter 1210, and thus, an edge EG2 of the inversion signal CLKB of the clock signal CLK has a phase difference of about 180 degrees with respect to an edge EG1 of the clock signal CLK. The inversion signal CLKB of the clock signal CLK may be delayed by a phase of about 90 degrees through the slave delay locked loop 1230 in the data write mode. An edge EG4 of the delayed clock signal CLKD has a phase difference of about 270 degrees with respect to the edge EG1 of the clock signal CLK, and thus, the memory interface circuit may output the delayed clock signal CLKD that may be delayed by a phase of about 270 degrees with respect to the clock signal CLK.

The data strobe signal DQS may be delayed by a phase of about 90 degrees through the slave delay locked loop 1230 and may be output in the data read mode. An edge EG5 of the delayed data strobe signal DQSD has a phase difference of about 90 degrees with respect to an edge EG3 of the data strobe signal DQS. Thus, by using the same delay locked loop, the clock signal CLK and the data strobe signal DQS may be delayed by phases different from each other.

Figure 3:
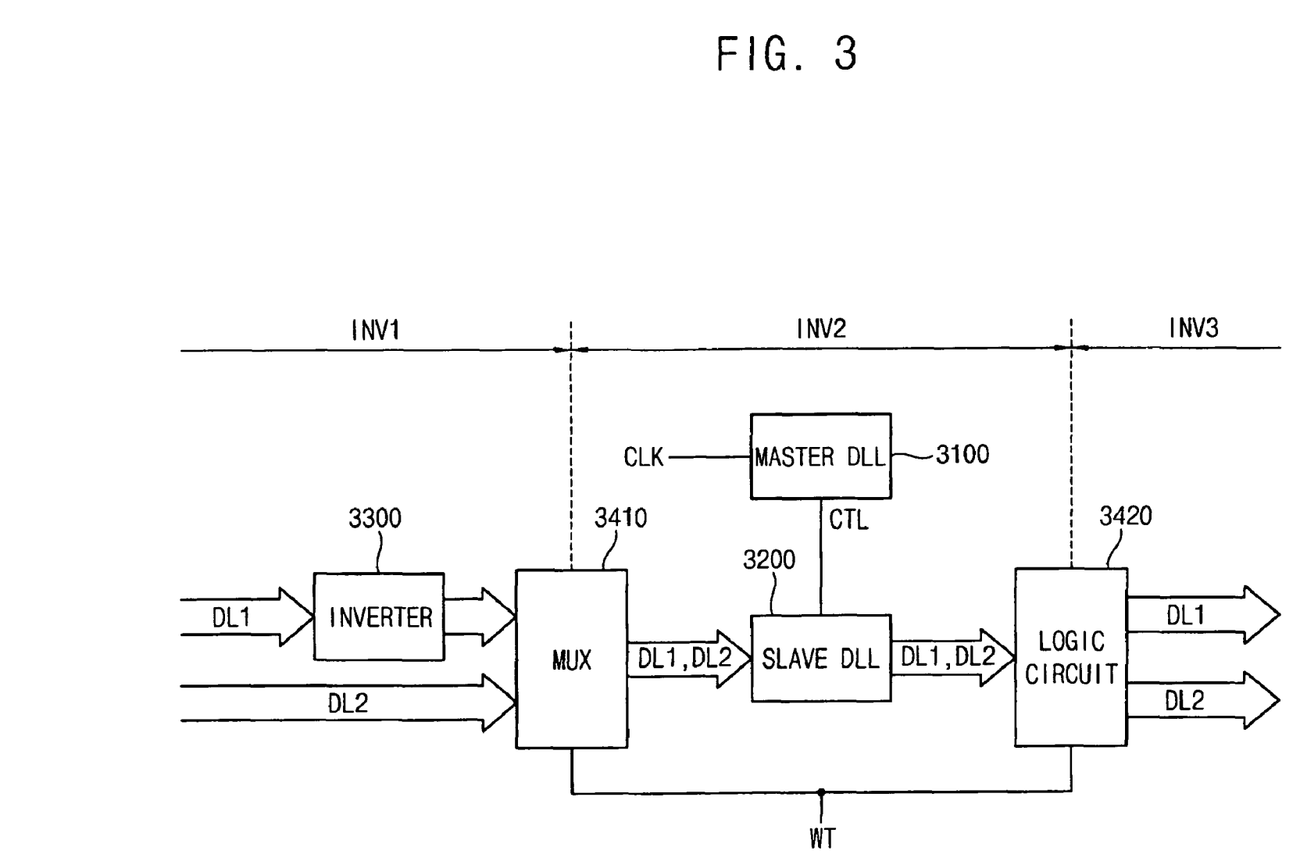
FIG. 3 is a block diagram illustrating a memory interface circuit according to example embodiments.

FIG. 3 is a block diagram illustrating a memory interface circuit according to example embodiments. Referring to FIG. 3, the memory interface circuit may include a master delay locked loop 3100, a slave delay locked loop 3200, an inverter 3300 and a selecting unit 3410 and 3420.

The master delay locked loop 3100 may provide a control signal CTL to the slave delay locked loop 3200 that controls a delay time based on a clock signal CLK such that the control signal CTL controls a delay time of signals that may be transmitted through a first delay path DL1 or a second delay path DL2.

The first delay path DL1 and the second delay path DL2 may be paths through which different signals may be delayed and transmitted, respectively. The first delay path DL1 and the second delay path DL2 may partially share a physical delay line. For example, as illustrated in FIG. 3, the first delay path DL1 and the second delay path DL2 may be physically separated in a first section INV1 and a third section INV3, and the first delay path DL1 and the second delay path DL2 share a physical delay line in a second section INV2.

The slave delay locked loop 3200 delays signals transmitted through the first delay path DL1 and the second delay path DL2 by the same phase. The first delay path DL1 and the second delay path DL2 may include the slave delay locked loop 3200. In example embodiments, the delay line that may be physically shared by the first delay path DL1 and the second delay path DL2 in the second section INV2 may include the slave delay locked loop 3200.

The inverter 3300 inverts the signal transmitted through the first delay path DL1. As illustrated in FIG. 3, the inverter 3300 may be located in the first section INV1 of the delay path. Alternatively, the inverter 3300 may be located in the second section INV2 or the third section INV3. A section where the inverter 3300 may be located may be varied according to example embodiments, and timing relations of signals may be varied according to the section.

The selecting unit 3410 and 3420 activates one of the first delay path DL1 and the second delay path DL2 in response to the mode signal WT and deactivates the other delay path. The mode signal WT indicating the data write mode has a logic level that may be different from a logic level of the mode signal WT indicating the data read mode. The selecting unit 3410 and 3420 may include a multiplexer 3410 and a logic circuit 3420. The multiplexer 3410 selects one of the first delay path DL1 and the second delay path DL2 in response to the logic level of the mode signal WT and provides the slave delay locked loop 3200 with a signal input through the selected delay path. The logic circuit 3420 activates one of the first delay path DL1 and the second delay path DL2 that may be selected by multiplexer 3410 and deactivates the other delay path that may not be selected by multiplexer 3410.

Figure 4:
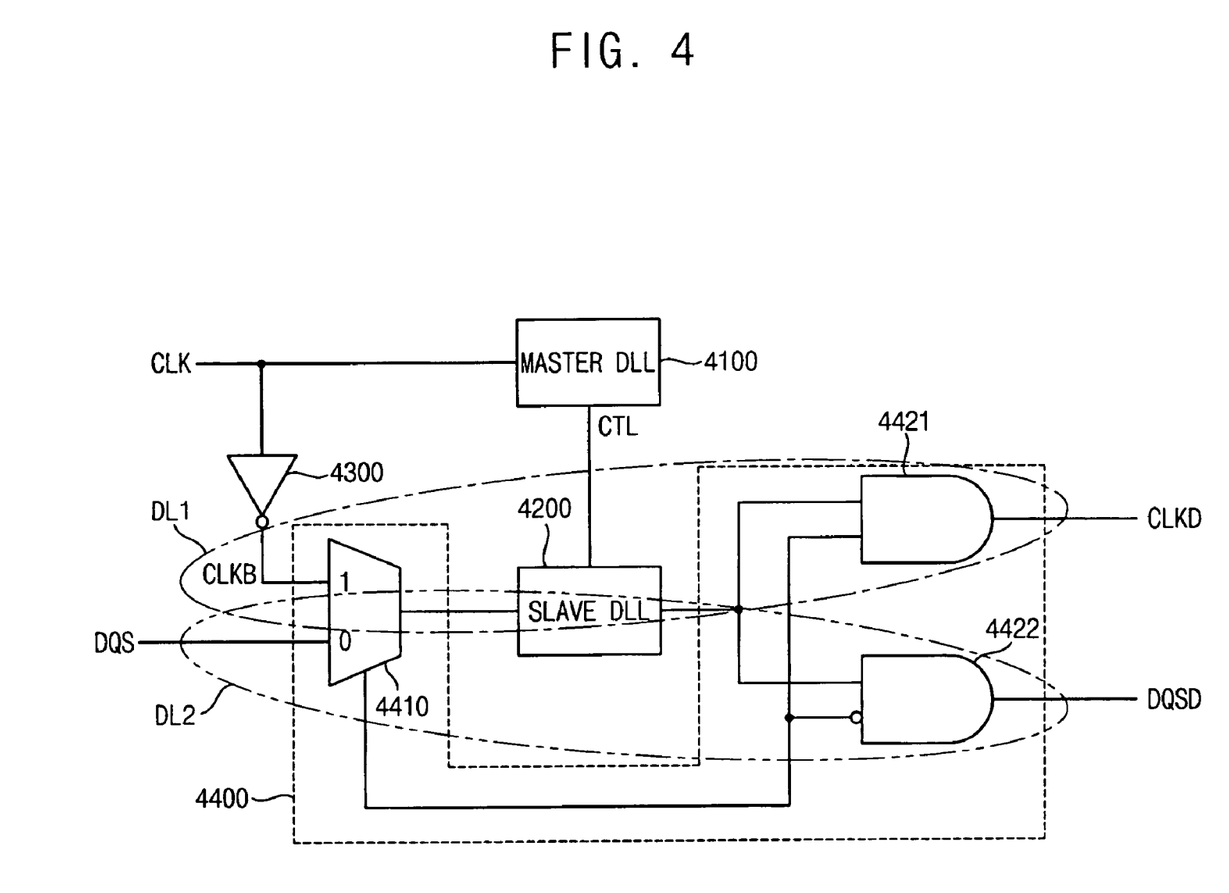
FIG. 4 is a block diagram illustrating relations between elements of the memory interface circuit of FIG. 3 and elements of the memory interface circuit of FIG. 1.

FIG. 4 is a block diagram illustrating relations between elements of the memory interface circuit of FIG. 3 and elements of the memory interface circuit of FIG. 1. Referring to FIG. 4, the first delay path DL1 may include an inverter 4300, a multiplexer 4410, a slave delay locked loop 4200 and a first logic gate 4421, through which a clock signal CLK may be delayed and output as the delayed clock signal CLKD. The second delay path DL2 may include the multiplexer 4410, the slave delay locked loop 4200 and a second logic gate 4422, through which a data strobe signal DQS may be delayed and output as the delayed data strobe signal DQSD. A selecting unit 4400 may include the multiplexer 4410, the first logic gate 4421 and the second logic gate 4422.

Figure 5:
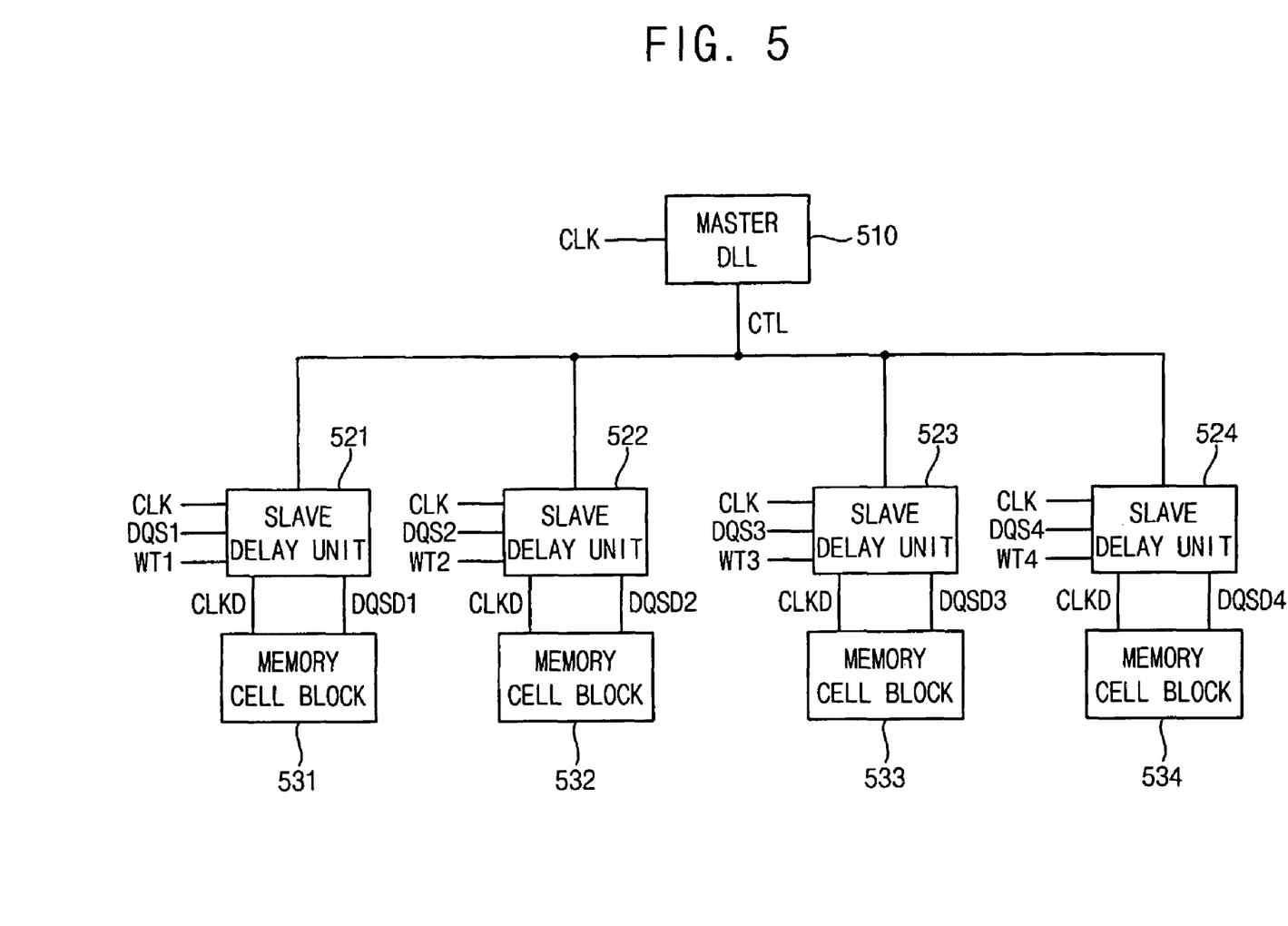
FIG. 5 is a block diagram illustrating a memory interface circuit that provides delayed clock signals and delayed data strobe signals to a plurality of memory blocks according to example embodiments.

FIG. 5 is a block diagram illustrating a memory interface circuit that provides delayed clock signals and delayed data strobe signals to a plurality of memory blocks according to example embodiments. Referring to FIG. 5, a master delay locked loop 510 provides a control signal CTL that controls a delay time in response to a clock signal CLK to a plurality of slave delay units 521, 522, 523 and 524. The slave delay units 521, 522, 523 and 524 may selectively output delayed clock signals CLKD by delaying the clock signal CLK by a first phase or delay data strobe signals DQSD 1, DQSD2, DQSD3 and DQSD4 by delaying data strobe signals DQS1, DQS2, DQS3 and DQS4 by second phases in response to mode signals WT1, WT2, WT3 and WT4, respectively. The slave delay units 521, 522, 523 and 524 provide the delayed clock signals CLKD to memory cell blocks 531, 532, 533 and 534 when the mode signals WT1, WT2, WT3 and WT4 indicate a data write mode. The slave delay units 521, 522, 523 and 524 provide the delayed data strobe signals DQSD 1, DQSD2, DQSD3 and DQSD4 to the memory cell blocks 531, 532, 533 and 534 when the mode signals WT1, WT2, WT3 and WT4 indicate a data read mode.

The delayed clock signal CLKD and one of delayed data strobe signals DQSD 1, DQSD2, DQSD3 and DQSD4 that may be transmitted to a corresponding one of the memory cell blocks 531, 532, 533 and 534 may be delayed by a single slave delay locked loop included in a corresponding one of slave delay units 521, 522, 523 and 524. In example embodiments, a memory cell block that receives a delayed clock signal and a delayed data strobe signal through the single slave delayed locked loop may include memory cells of 8 bits.

Figure 6:
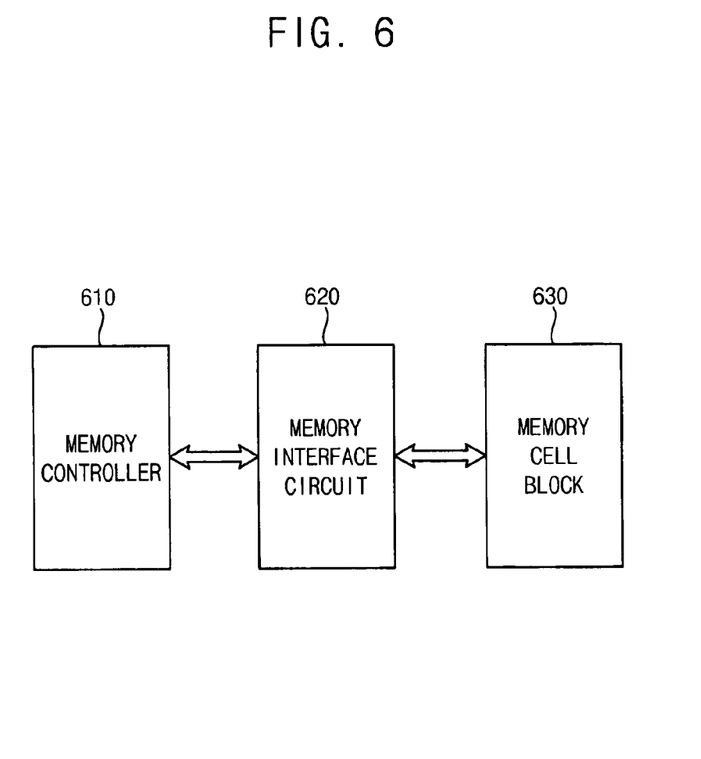
FIG. 6 is a block diagram illustrating a memory system according to example embodiments.

FIG. 6 is a block diagram illustrating a memory system according to example embodiments. Referring to FIG. 6, the memory system may include a memory cell block 630, a memory controller 610 and a memory interface circuit 620. The memory cell block 630 may include a plurality of memory cells for storing data. The memory controller 610 controls access for writing the data to the memory cell block 630 or reading the data from the memory cell block 630. The memory interface circuit 620 transfers data between the memory controller 610 and the memory cell block 630. The memory interface circuit 620 may be implemented with the memory interface circuit illustrated in FIG. 1 and provides a delayed clock signal and a delayed data strobe signal to the memory cell block 630.

The memory interface circuit 620 inverts and delays a clock signal and provides the delayed clock signal having a phase difference of about 270 degrees with respect to the clock signal to the memory cell block 630 in a data write mode. The memory interface circuit 620 delays a data strobe signal and provides the delayed data strobe signal having a phase difference of about 90 degrees with respect to the data strobe signal to the memory cell block 630 in a data read mode. Thus, the memory interface circuit 620 may provide the clock signal and the data strobe signal that may be delayed by phases different from each other by using a single slave delay locked loop to the memory cell block 630.

As described above, the memory interface circuit and the memory system including the memory interface circuit according to example embodiments may include a single delay locked loop for delaying the clock signal and the data strobe signal by phases different from each other. Therefore, the number of the delay locked loops may be included in the memory interface circuit may be decreased, and thus, a size of a semiconductor chip and power consumption may be decreased.

While example embodiments and their advantages have been described in detail, it should be understood that various changes, substitutions and alterations may be made herein without departing from the scope of example embodiments.

What is claimed is:

1. A memory interface circuit comprising:
   a master delay unit configured to generate a control signal for controlling a delay time based on a clock signal; and
   a slave delay unit configured to select one of an inversion signal of the clock signal and a data strobe signal in response to a mode signal, delay the selected signal in response to the control signal, and selectively output a delayed clock signal delayed by a first phase with respect to the clock signal or a delayed data strobe signal delayed by a second phase with respect to the data strobe signal.

2. The memory interface circuit of claim 1, wherein the mode signal has a first logic level in a data write mode, and has a second logic level in a data read mode.

3. The memory interface circuit of claim 2, wherein the slave delay unit outputs the delayed clock signal in the data write mode and outputs the delayed data strobe signal in the data read mode.

4. The memory interface circuit of claim 1, wherein the slave delay unit includes:
   an inverter configured to invert the clock signal and output the inversion signal of the clock signal;
   a multiplexer configured to select one of the inversion signal of the clock signal and the data strobe signal in response to the mode signal;
   a slave delay locked loop configured to delay the selected signal in response to the control signal; and
   an output unit configured to receive an output signal of the slave delay locked loop and output the output signal of the slave delay locked loop selectively as the delayed clock signal or as the delayed data strobe signal.

5. The memory interface circuit of claim 4, wherein the multiplexer selects the inversion signal of the clock signal in a data write mode and selects the data strobe signal in a data read mode.

6. The memory interface circuit of claim 4, wherein the output unit outputs the delayed clock signal in a data write mode and outputs the delayed data strobe signal in a data read mode.

7. The memory interface circuit of claim 6, wherein the output unit includes:
   a first logic gate configured to receive the output signal of the slave delay locked loop and the mode signal and perform an AND operation on the output signal of the slave delay locked loop and the mode signal; and
   a second logic gate configured to receive the output signal of the slave delay locked loop and an inversion signal of the mode signal and perform an AND operation on the output signal of the slave delay locked loop and the inversion signal of the mode signal.

8. The memory interface circuit of claim 4, wherein the slave delay locked loop delays the selected signal by a phase of about 90 degrees.

9. The memory interface circuit of claim 1, wherein the first phase is about 270 degrees and the second phase is about 90 degrees.

10. The memory interface circuit of claim 1, wherein the memory interface circuit is a double data rate (DDR) memory interface circuit.

11. A memory system comprising:
    a memory cell block configured to include a plurality of memory cells for storing data;
    a memory controller configured to control access for writing the data to the memory cell block or reading the data from the memory cell block; and
    the memory interface circuit of claim 1 configured to transfer the data between the memory controller and the memory cell block.

12. The memory system of claim 11, wherein the slave delay unit includes:
    an inverter configured to invert the clock signal and configured to output the inversion signal of the clock signal;
    a multiplexer configured to select one of the inversion signal of the clock signal and the data strobe signal in response to the mode signal;
    a slave delay locked loop configured to delay the selected signal in response to the control signal; and
    an output unit configured to receive an output signal of the slave delay locked loop and output the output signal of the slave delay locked loop selectively as the delayed clock signal or as the delayed data strobe signal.

13. The memory system of claim 11, wherein the first phase is about 270 degrees and the second phase is about 90 degrees.

14. A memory interface circuit comprising:
    a master delay locked loop configured to generate a control signal for controlling a delay time of a first signal transmitted through a first delay path or a second signal transmitted through a second delay path based on a clock signal;
    a slave delay locked loop shared by the first delay path and the second delay path, the slave delay locked loop configured to delay the first signal transmitted through the first delay path or the second signal transmitted through the second delay path by a same phase in response to the control signal;
    an inverter configured to invert the first signal transmitted through the first delay path; and
    a selecting unit configured to activate one of the first delay path and the second delay path in response to a mode signal.

15. The memory interface circuit of claim 14, wherein the selecting unit activates the first delay path in a data write mode and activates the second delay path in a data read mode.

16. The memory interface circuit of claim 15, wherein the selecting unit includes:
   a multiplexer configured to provide the first signal or the second signal to the slave delay locked loop by selecting one of the first delay path and the second delay path in response to the mode signal; and
   a logic circuit configured to activate the delay path selected by the multiplexer and configured to deactivate non-selected delay path.

17. The memory interface circuit of claim 16, wherein the logic circuit includes:
   a first logic gate configured to activate the first delay path in the data write mode and to deactivate the first delay path in the data read mode in response to the mode signal; and
   a second logic gate configured to deactivate the second delay path in the data write mode and to activate the second delay path in the data read mode in response to the mode signal.

18. The memory interface circuit of claim 15, wherein the clock signal is delayed by the first delay path and a data strobe signal is delayed by the second delay path.

19. The memory interface circuit of claim 18, wherein the slave delay locked loop delays a signal transmitted through the activated delay path by a phase of about 90 degrees.

20. The memory interface circuit of claim 14, an output signal of the activated delay path is provided to a memory block including a plurality of memory cells.

21. A memory system comprising:
   a memory cell block configured to include a plurality of memory cells for storing data;
   a memory controller configured to control access for writing the data to the memory cell block or reading the data from the memory cell block; and
   the memory interface circuit of claim 14 configured to transfer the data between the memory controller and the memory cell block.

* * * * *